(12) United States Patent
Gu et al.

(10) Patent No.: US 10,937,936 B2
(45) Date of Patent: Mar. 2, 2021

(54) LED DISPLAY UNIT GROUP AND DISPLAY PANEL

(71) Applicant: FOSHAN NATIONSTAR OPTOELECTRONICS CO., LTD., Foshan (CN)

(72) Inventors: Feng Gu, Foshan (CN); Kuai Qin, Foshan (CN); Yuanbin Lin, Foshan (CN); Bin Cai, Foshan (CN)

(73) Assignee: FOSHAN NATIONSTAR OPTOELECTRONICS CO., LTD., Foshan (CN)

( * ) Notice: Subject to any disclaimer, the term of this patent is extended or adjusted under 35 U.S.C. 154(b) by 0 days.

(21) Appl. No.: 16/502,101

(22) Filed: Jul. 3, 2019

(65) Prior Publication Data

US 2020/0083420 A1 Mar. 12, 2020

(30) Foreign Application Priority Data

Sep. 10, 2018 (CN) .......................... 201811052787.0

(51) Int. Cl.
*H01L 33/62* (2010.01)
*H01L 23/538* (2006.01)
*H01L 25/075* (2006.01)

(52) U.S. Cl.
CPC .......... *H01L 33/62* (2013.01); *H01L 23/5383* (2013.01); *H01L 23/5384* (2013.01); *H01L 25/0753* (2013.01)

(58) Field of Classification Search
CPC ... H01L 32/62; H01L 27/156; H01L 25/0756; H01L 27/03211; H01L 27/3218

(Continued)

(56) References Cited

U.S. PATENT DOCUMENTS

2009/0230413 A1* 9/2009 Kobayakawa ........ H01L 33/483
 257/91
2013/0193468 A1* 8/2013 Hussell ................. H01L 33/62
 257/98

(Continued)

FOREIGN PATENT DOCUMENTS

| CN | 103534821 A | 1/2014 |
|----|-------------|--------|
| CN | 203707120 U | 7/2014 |

(Continued)

OTHER PUBLICATIONS

Korean Office Action.
Taiwan Office Action.

*Primary Examiner* — David Vu
*Assistant Examiner* — Brandon C Fox
(74) *Attorney, Agent, or Firm* — Bond Schoeneck & King, PLLC; George McGuire (57) ABSTRACT

Provided is a light-emitting diode (LED) display unit group and a display panel. The LED display unit group includes a circuit board, and a pixel unit array located on the circuit board. The pixel unit array includes a plurality of pixel units arranged in n rows and m columns, n and m are both positive integers and greater than or equal to 2. Each of the pixel units includes multiple LED light-emitting chips of at least two colors, each of the LED light-emitting chips includes an electrode A and an electrode B of opposite polarities. The LED light-emitting chip of each of the pixel units includes at least one dual-electrode chip, the dual-electrode chip has the electrode A and the electrode B located on a same side of the dual-electrode chip. All dual-electrode chips in the plurality of pixel units of a same color have connecting lines from the electrode A to the electrode B directed in a same direction.

16 Claims, 5 Drawing Sheets

(58) Field of Classification Search
USPC .................................................... 257/89, 98
See application file for complete search history.

(56) References Cited

U.S. PATENT DOCUMENTS

| | | | | |
|---|---|---|---|---|
| 2013/0256710 | A1* | 10/2013 | Andrews | H01L 24/97 |
| | | | | 257/88 |
| 2014/0353694 | A1* | 12/2014 | Pang | H01L 24/97 |
| | | | | 257/89 |
| 2015/0294959 | A1* | 10/2015 | Lee | H01L 25/0753 |
| | | | | 257/89 |
| 2017/0009971 | A1* | 1/2017 | Chan | H01L 25/0753 |

FOREIGN PATENT DOCUMENTS

| | | | |
|---|---|---|---|
| JP | 2011151187 | A | 8/2011 |
| KR | 1020120021574 | A | 3/2012 |
| KR | 1020170101056 | A | 9/2017 |
| KR | 1020180079814 | A | 7/2018 |
| TW | 201608742 | A | 3/2016 |
| TW | 201735320 | A | 10/2017 |

* cited by examiner

LED DISPLAY UNIT GROUP AND DISPLAY PANEL

CROSS-REFERENCE TO RELATED APPLICATIONS

This application claims priority to Chinese patent application No. 201811052787.0 filed with the Patent Office of the People's Republic of China on Sep. 10, 2018, the disclosure of which is incorporated herein by reference in its entirety.

TECHNICAL FIELD

The embodiments of the present disclosure relate to LED display technology and, in particular, relate to a LED display unit group and a display panel.

BACKGROUND

With the continuous improvement of indoor display application technology, an indoor small-pitch LED display screen becomes the main technology expansion space in the future. In order to replace indoor high-definition display product such as LCD and DLP, the indoor small-pitch LED display screen is required to have larger and larger pixel unit density, that is, the pixel unit pitch is required to be smaller and smaller.

The existing small-pitch display screen mainly adopts independent packaging devices of types such as 2121, 1515, 1010 and 0808. Each packaging device includes four pins. The pins of multiple independent packaging devices are welded on a PCB board to form a display panel. As LED display screen rapidly develops toward the small-pitch, the size of corresponding light-emitting unit is continuously reduced. The more the integrated light-emitting units are, the more pins the LED display panel contains. It results in difficulty in welding operation and a more complex circuit of PCB board.

Figure 1:
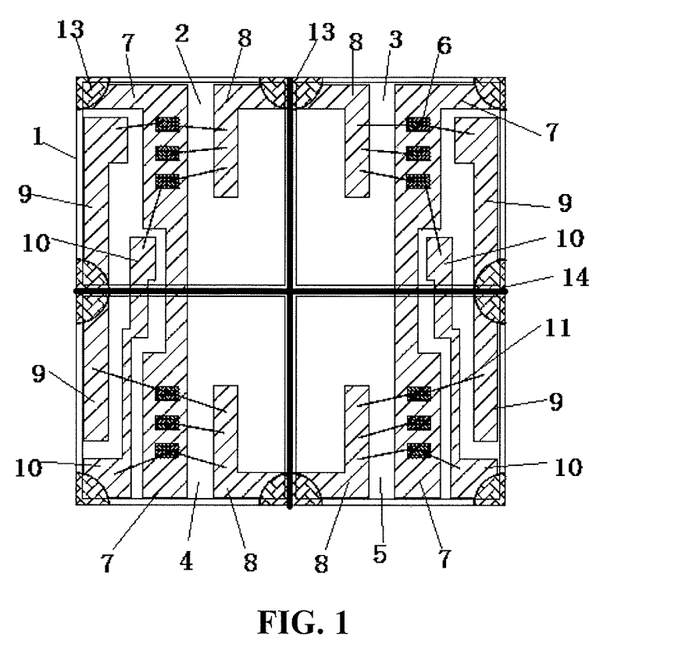
FIG. 1 is a front structural schematic diagram of a tetrad-8-pins-type RGB-LED packaging module provided in the related art.

The patent No. 201721050110.4 titled "a tetrad-and-8-pins-type RGB-LED packaging module and a display screen thereof" proposes that functional zones of two light-emitting units share a pin bonding pad, so that the number of the pin bonding pads for the whole packaging module is manyfold reduced. FIG. 1 is a front structural schematic diagram of the tetrad-8-pins-type RGB-LED packaging module in the related art. Referring to FIG. 1, a die bond zone 7, a first bonding zone 9 and a second bonding zone 10 of a first light-emitting unit 2 are respectively mirror symmetrically arranged with the die bond zone 7, a first bonding zone 9 and a second bonding zone 10 of a second light-emitting unit 3 of the same row with respect to a bisector of the first light-emitting unit 2 and the second light-emitting unit 3.

A LED light-emitting chip is fixed in the die bond zone 7 by a die bonder. As corresponding bonding zones of two light-emitting units of the same row are mirror symmetrically arranged, the LED light-emitting chips of the light-emitting units of adjacent columns are also required to be mirror symmetrically arranged, that is, the anodes or cathodes of the LED light-emitting chips of the light-emitting units of adjacent columns are oppositely arranged. Therefore, during the die bond process, in light-emitting units of two columns, the LED light-emitting chips of the same light-emitting color respectively requires one die bonder to implement the die bond. Alternatively, after finishing the die bond of the light-emitting units of one column, the orientation of the LED light-emitting chip is adjusted to implement the die bond of the light-emitting units of the other column. In this way, the efficiency of the die bond is slow, and the location accuracy of the LED light-emitting chip after the die bond is low.

SUMMARY

The present disclosure provides a LED display unit group and a display panel, to improve the efficiency of die bond, and to guarantee the location accuracy of a LED light-emitting chip after die bond.

In a first aspect, a LED display unit group is provided in an embodiment of the present disclosure, including a circuit board and a pixel unit array located on the circuit board. The pixel unit array includes a plurality of pixel units arranged in n rows and m columns, n and m are both positive integers and greater than or equal to 2.

Each of the pixel units includes multiple LED light-emitting chips of at least two colors. Each of the LED light-emitting chips includes an electrode A and an electrode B of opposite polarities.

The LED light-emitting chips of each of the pixel units includes at least one dual-electrode chip. The dual-electrode chip has the electrode A and the electrode B located on a same side of the dual-electrode chip.

All dual-electrode chips of a same color in the plurality of pixel units have connecting lines from the electrode A to the electrode B directed in a same direction.

In an embodiment, the circuit board includes an insulating substrate, a front wiring board located on a front side of the insulating substrate, and a back wiring board located on a back side of the insulating substrate. The insulating substrate is provided with a metal via hole and/or a metal column for connecting the front wiring board and the back wiring board.

The LED light-emitting chips are fixed on the front wiring board, the electrode A and the electrode B of each of the LED light-emitting chips are electrically connected to the front wiring board.

In an embodiment, the back wiring board includes a number n of common electrode A pins and a number 3m of electrode B pins.

Electrodes A of all LED light-emitting chips of each row of pixel units are electrically connected together and to a respective one of the common electrode A pins corresponding to the each row of pixel units.

Electrodes B of all LED light-emitting chips of a same color of each column of pixel units are electrically connected together and to a respective one of the electrode B pins corresponding to the LED light-emitting chips of the same color of the each column of pixel units.

In an embodiment, n is equal to 2, and m is equal to 2.

In an embodiment, each of the LED light-emitting chips is one of a red LED light-emitting chip, a green LED light-emitting chip or a blue LED light-emitting chip.

In an embodiment, the metal via hole has a diameter equal to or greater than 0.2 mm and is filled with an insulating material.

In an embodiment, the metal column has a diameter less than 0.2 mm.

In an embodiment, the back side of the circuit board is provided with an insulating layer. The insulating layer covers a rear metal wire on the back wiring board.

In an embodiment, the back side of the circuit board is provided with an identification mark for identifying a polarity of each of the common electrode A pins and the electrode B pins.

In an embodiment, the insulating layer includes two insulating materials of different colors. The insulating layer is divided into two parts of different colors by a boundary between the two insulating materials of different colors.

In an embodiment, a surface of the insulating layer is provided with an insulating material having a different color from the insulting layer for forming the identification mark for identifying a polarity of each of the common electrode A pins and the electrode B pins.

In a second aspect, a display panel is also provided in an embodiment of the present disclosure, including a LED display unit group according to any one of the first aspect of the present disclosure.

A number m×n of pixel units are packaged together to form one LED display unit group provided by the embodiments of the present disclosure. Each of the pixel units includes multiple LED light-emitting chips of at least two colors. The LED light-emitting chips of each pixel unit includes at least one dual-electrode chip. The dual-electrode chip has the electrode A and electrode B located on the same side of the dual-electrode chip. All dual-electrode chips of the same color in the plurality of pixel units have connecting lines from the electrode A to the electrode B directed in the same direction. During the die bond process, the die bond of all LED light-emitting chips of the same color in the LED display unit group can be finished by adopting one die bonder without adjusting working position. The efficiency of the die bond is improved, and at the same time a higher location accuracy of the LED light-emitting chip after die bond is guaranteed.

DETAILED DESCRIPTION

The present disclosure is further described below in detail with reference to accompanying drawings and embodiments. It should be understood that the specific embodiments described here are only illustrative and not intended to limit the present disclosure. It should also be noted that, for the sake of description, only part, but not all, of the structures related to the present disclosure are shown in the drawings.

In the embodiments of the present disclosure, where not stated to the contrary, the orientation words, such as "up", "down", "left", "right", "top", "bottom" are generally used to describe the mutual location relationship of components in terms of the direction shown in the drawings or in terms of vertical, perpendicular and gravity direction.

A LED display unit group is provided in the embodiments of the present disclosure. The LED display unit group includes a circuit board, and a pixel unit array located on the circuit board. The pixel unit array includes a plurality of pixel units arranged in n rows and m columns, where n and m are both positive integers and greater than or equal to 2.

Each of the pixel units includes multiple LED light-emitting chips of at least two colors. Each of the LED light-emitting chips includes an electrode A and an electrode B of opposite polarities.

The LED light-emitting chips of each of the pixel units includes at least one dual-electrode chip. The dual-electrode chip has the electrode A and the electrode B located on a same side of the dual-electrode chip.

All dual-electrode chips of a same color in the plurality of pixel units have connecting lines from the electrode A to the electrode B directed in a same direction.

In an embodiment of the present disclosure, the present disclosure is described in an example in which m is equal to 2, n is equal to 2, each of the pixel units includes three LED light-emitting chips of different colors, the electrode A is the cathode of the LED chip and the electrode B is the anode of the LED chip. It should be noted that the dual-electrode chip of the present disclosure may be a positive-assembling chip of which the anode and the cathode are located on a light-emitting side of the LED light-emitting chip; or the dual-electrode chip may be an inverted-assembling chip of which the anode and the cathode are located on a side opposite to the light-emitting side of the LED light-emitting chip. The embodiment of the present disclosure is illustrated by taking the dual-electrode chip as a positive-assembling chip.

Figure 2:
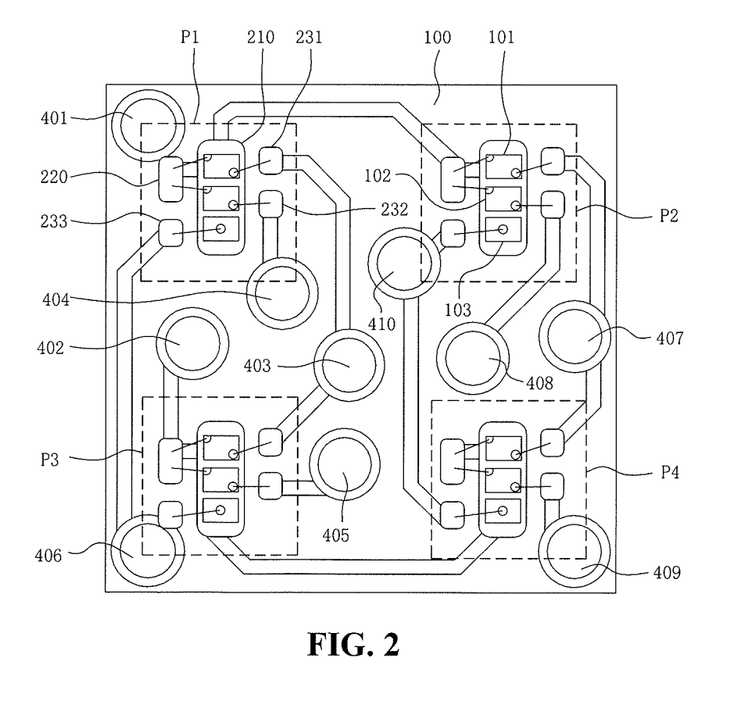
FIG. 2 is a front wiring diagram of a LED display unit group provided by an embodiment of the present disclosure.

FIG. 2 is a front wiring diagram of the LED display unit group provided by an embodiment of the present disclosure. As shown in FIG. 2, the LED display unit group includes four pixel units arranged in an array, which are respectively a first pixel unit P1, a second pixel unit P2, a third pixel unit P3 and a fourth pixel unit P4. Each pixel unit includes three LED light-emitting chips of different colors. The three LED light-emitting chips, which are respectively a first LED light-emitting chip 101, a second LED light-emitting chip 102 and a third LED light-emitting chip 103, are arranged in a column. In the embodiment, each of the first LED light-emitting chip 101 and the second LED light-emitting chip 102 is a dual-electrode chip, of which the anode and the cathode are located on a light-emitting side of the dual-electrode chip (i.e., positive-assembling chip); the third LED light-emitting chip 103 is a single-electrode chip, of which the anode and the cathode are located on two opposite sides of the single-electrode chip. The three LED light-emitting chips are fixed on respective die bond zones of the circuit board. All dual-electrode chips of the same color in all pixel units have connecting lines from the anode to the cathode directed in the same direction. As shown in FIG. 2, the four first LED light-emitting chips 101 have the connecting lines from the anode to the cathode directed in a same direction, and the four second LED light-emitting chips 102 have connecting lines from the anode to the cathode directed in a same direction. Thus, the LED light-emitting chips of the same color have a same die bone angle. During the die bond process, the die bond of the LED light-emitting chips of the same color in the LED display unit group can be finished by adopting one die bonder without adjusting working position. The efficiency of the die bond is improved, and at the same time the higher location accuracy of the LED light-emitting chip after the die bond is guaranteed. In the embodiment of the present disclosure, all dual-electrode chips in the LED display unit group have connecting lines from the anode to the cathode directed in a same direction. During the die bond process, the die bond of all LED light-emitting chips in the LED display unit group is finished by adopting one die bonder without adjusting the working position, further improving the efficiency of the die bond.

A number m×n of pixel units are packaged together to form one LED display unit group provided by the embodiment of the present disclosure. Each pixel unit includes multiple LED light-emitting chips of at least two colors. The LED light-emitting chips of each pixel unit includes at least one dual-electrode chip. The dual-electrode chip has the electrode A and electrode B located on the same side of the dual-electrode chip. All dual-electrode chips of the same color in the plurality of pixel units have connecting lines from the electrode A to the electrode B directed in the same direction. During the die bond process, the die bond of all LED light-emitting chips of the same color in the LED display unit group can be finished by adopting one die bonder without adjusting working position. The efficiency of the die bond is improved, and at the same time a higher location accuracy of the LED light-emitting chip after die bond is guaranteed.

Figure 3:
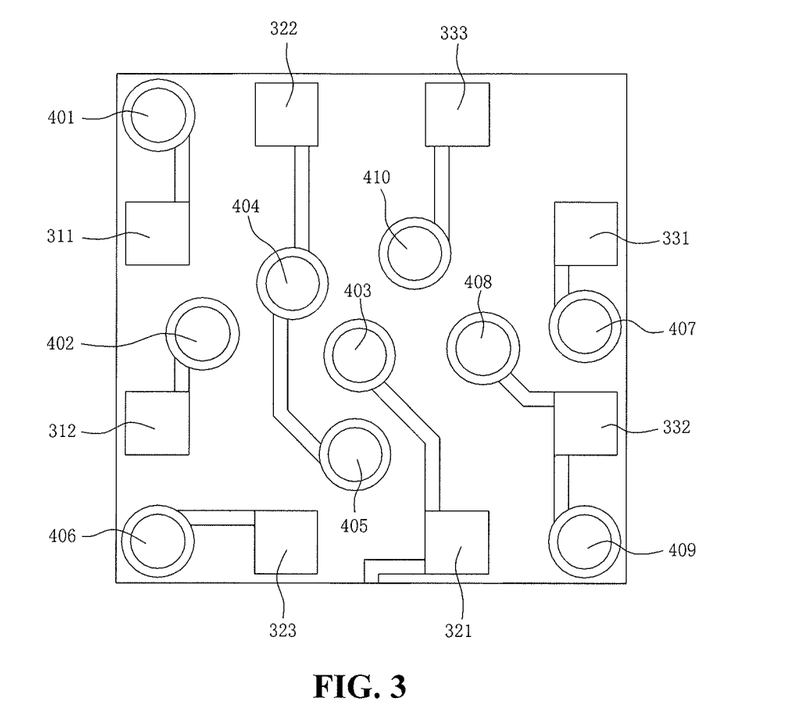
FIG. 3 is a back wiring diagram of the LED display unit group of FIG. 2.
Figure 4:
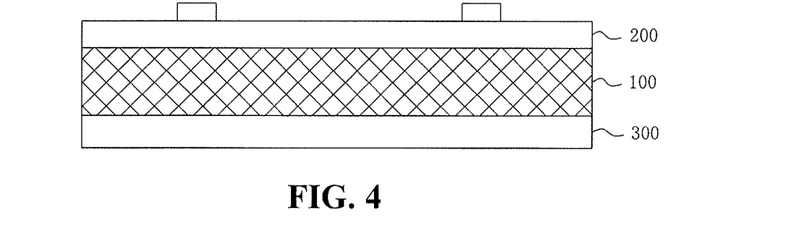
FIG. 4 is a front structural diagram of the LED display unit group provided by an embodiment of the present disclosure.

FIG. 3 is a back wiring diagram of the LED display unit group of FIG. 2. FIG. 4 is a front structural schematic diagram of the LED display unit group provided by an embodiment of the present disclosure. Referring to FIG. 2 to FIG. 4, the circuit board includes an insulating substrate 100, a front wiring board 200 located on the front side of the insulating substrate 100, and a back wiring board 300 located on the back side of the insulating substrate 100. The insulating substrate 100 is provided with a metal via hole and/or metal column for connecting the front wiring board 200 and the back wiring board 300. The LED light-emitting chips are fixed on the front wiring board 200, the anode and the cathode of each LED light-emitting chip are electrically connected to the front wiring board 200. Exemplarily, in the embodiment of the present disclosure, as shown in FIG. 2 and FIG. 3, the LED display unit group includes four pixel units arranged in an array, which are respectively the first pixel unit P1, the second pixel unit P2, the third pixel unit P3 and the fourth pixel unit P4. In the embodiment, the first LED light-emitting chip 101 and the second-emitting chip 102 are positive-assembling dual-electrode chips, while the third LED light-emitting chip 103 is a single-electrode chip. The cathode of the third LED light-emitting chip 103 is fixed on the die bonding pad 210 through a conducting material such as conductive silver adhesive or solder paste. The non-light-emitting side of the first LED light-emitting chip 101 and the second light-emitting chip 102 are fixed on the die bonding pad 210 through an insulating material. All dual-electrode chips in the LED display unit group have connecting lines from the anode to the cathode directed in the same direction.

On the front wiring board 200, the zone where each pixel unit is located includes a die bonding pad 210, a common cathode bonding pad 220, a first anode bonding pad 231, a second anode bonding pad 232 and a third anode bonding pad 233. In each pixel unit, the cathodes of the first LED light-emitting chip 101 and the second LED light-emitting chip 102 are electrically connected to the common cathode bonding pad 220 through respective metal leads, the cathode of the third LED light-emitting chip 103 is fixed on the die bonding pad 210 through the conducting material such as conductive silver adhesive or solder paste; the anodes of the first LED light-emitting chip 101, the second LED light-emitting chip 102 and the third LED light-emitting chip 103 are electrically connected to the first anode bonding pad 231, the second anode bonding pad 232 and the third anode bonding pad 233, respectively, through respective metal leads. In each pixel unit, the die bonding pad 210 is connected with the common cathode bonding pad 220 through a front metal wire on the front side of the insulating substrate 100. The electrical connection between the die bonding pad 210 and the common cathode bonding pad 220 implements the electrical connection from the cathodes of the three LED chips to the common cathode bonding pad 220.

In an embodiment, in each pixel unit, the die bonding pad 210 has an elongated shape and arranged along the column direction. The common cathode bonding pad 220 and the third anode bonding pad 233 are located on a first side of the die bonding pad 210, i.e., the left side of the die bonding pad 210 in FIG. 2. The first anode bonding pad 231 and the second anode bonding pad 232 are located on a second side of the die bonding pad 210 opposite to the first side, i.e., the right side of the die bonding pad 210 in FIG. 2. Thus, the bonding pads are arranged in a more compact manner, which helps to reduce the size of the display unit group and to improve the resolution of the display panel.

In an embodiment, the back wiring board includes a number n of common electrode A pins and a number 3m of electrode B pins.

Electrodes A of all LED light-emitting chips of each row of pixel units are electrically connected together, and to a respective one of common electrode A pins corresponding to the each row of pixel units.

Electrodes B of all LED light-emitting chips of a same color of each column of pixel units are electrically connected together, and to a respective one of the electrode B pins corresponding to the LED light-emitting chips of the same color of the each column of the pixel units.

In the embodiment of the present disclosure, as shown in FIG. 2 and FIG. 3, the back wiring board 300 includes two common cathode pins and six anode pins. The two common cathode pins and the six anode pins are arranged on a marginal area on the back side of the circuit board. The two common cathode pins, i.e., a common cathode pin 311 and a common cathode pin 312, are located on the marginal area of one edge on the back side of the insulating substrate 100. Every two of the anode pins are arranged on the marginal area of respective one of the other edges.

The common cathode bonding pads of two pixel units of each row of pixel units are electrically connected, and to a respective one of the common cathode pins corresponding to the each row of pixel units. In this way, the cathodes of the all LED light-emitting chips of each row of pixel units are electrically connected, and to the respective one of the common cathode pins corresponding to the each row of the pixel units. Specifically, as shown in FIG. 2 and FIG. 3, the die bonding pad 210 of the first pixel unit P1 is electrically connected with the common cathode bonding pad 220 of the second pixel unit P2 through a front metal wire located on the front side of the insulating substrate 100. The common cathode bonding pad 220 of the first pixel unit P1 extends to the back side of the insulating substrate 100 through the metal via hole 401, and is electrically connected to a respective common cathode pin 311 corresponding to the first row of pixel unit through a rear metal wire on the back side of the insulating substrate 100. The die bonding pad 210 of the third pixel unit P3 is electrically connected with the die bonding pad 210 of the fourth pixel unit P4 through a front metal wire. The common cathode bonding pad 220 of the third pixel unit P3 is electrically connected with the metal via hole 402 through a front metal wire. The metal via hole 402 extends to the back side of the insulating substrate 100, and is electrically connected with a respective common cathode pin 312 corresponding to the second row of pixel units through a rear metal wire.

The first anode bonding pads of two pixel units of each column of pixel units are electrically connected, and to a respective first anode pin corresponding to the each column of pixel units. The second anode bonding pads of the two pixel units of each column of pixel units are electrically connected, and to a respective second anode pin corresponding to the each column of pixel units. The third anode bonding pads of the two pixel units of each column of pixel units are electrically connected, and to a respective third anode pin corresponding to the each column of pixel units. Thus, the anodes of LED light-emitting chips of the same color in each column of pixel units are electrically connected, and to the respective one anode pin corresponding to the LED light-emitting chips of the same color in the each column of pixel units. Specifically, as shown in FIG. 2 and FIG. 3, the first anode bonding pads 231 of the first pixel unit P1 and the third pixel unit P3 in the first column pixel unit are connected to the metal via hole 403 through respective front metal wires. The metal via hole 403 extends to the back side of the insulating substrate 100, and is electrically connected to a respective first anode pin 321 corresponding to the first column of pixel units through a rear metal wire. The second anode bonding pad 232 of the first pixel unit P1 is electrically connected with the metal via hole 404 through a front metal wire. The metal via hole 404 extends to the back side of the insulating substrate 100. The second anode bonding pad 232 of the third pixel unit P3 is electrically connected with the metal via hole 405 through a front metal wire. The metal via hole 405 extends to the back side of the insulating substrate 100. The metal via hole 404 and the metal via hole 405 are electrically connected together through a rear metal wire on the back side of the insulating substrate 100, and the metal via hole 404 is electrically connected with the second anode pin 322 of the first column of pixel units through another rear metal wire. The third anode bonding pad 233 of the third pixel unit P3 directly extends to the back side of the insulating substrate 100 through the metal via hole 406. The third anode bonding pad 233 of the first pixel unit P1 is electrically connected with the metal via hole 406 through a front metal wire. The metal via hole 406 is electrically connected with the third anode pin 323 of the first column of the pixel units through a rear metal wire. The first anode bonding pads 231 of the second pixel unit P2 and the fourth pixel unit P4 of the second column of pixel units are connected to the metal via hole 407 through respective front metal wires. The metal via hole 407 extends to the back side of the insulating substrate 100, and is electrically connected with the first anode pin 331 of the second column of pixel units through a rear metal wire. The second anode bonding pad 232 of the second pixel unit P2 is electrically connected with the metal via hole 408 through a front metal wire. The metal via hole 408 extends to the back side of the insulating substrate 100, and is electrically connected with the second anode pin 332 of the second column of the pixel units through a rear metal wire. The second anode bonding pad 232 of the fourth pixel unit P4 is electrically connected with the metal via hole 409 through a front metal wire. The metal via hole 409 extends to the back side of the insulating substrate 100, and is electrically connected with the second anode pin 332 of the second column of pixel units through a rear metal wire. The third anode bonding pads 233 of the second pixel unit P2 and the fourth pixel unit P4 are electrically connected with the metal via hole 410 through respective front metal wires. The metal via hole 410 extends to the back side of the insulating substrate 100, and is electrically connected with the third anode pin 333 of the second column of the pixel units through a rear metal wire. The two common cathode pins and the six anode pins are located on the back side of the insulating substrate.

It should be noted that the number and the location of the bonding pads, the location and number of the metal via holes and the metal wires in the embodiments of the present disclosure may vary according to actual conditions, and are not limited to the above conditions. It only needs to meet the electrical connection relationship corresponding to each bonding pad, as well as the electrical connection relationship between the bonding pads and the pins. That is, the common cathode bonding pads of two pixel units of each row of pixel units are electrically connected, and to a respective common cathode pin corresponding to the each row of the pixel units. The first anode bonding pads of the two pixel units of the each column of pixel units are electrically connected, and to a respective first anode pin corresponding to the each column of pixel units. The second anode bonding pads of the two pixel units are electrically connected, and to a respective second anode pin corresponding to the each column of the pixel units. The third anode bonding pads of the two pixel units are electrically connected, and to a respective third anode pin corresponding to the each column of the pixel units.

In an embodiment, each LED light-emitting chip is one of a red LED light-emitting chip, a green LED light-emitting chip and a blue LED light-emitting chip. In order to meet different wiring requirements on the PCB board, the first LED light-emitting chip 101, the second LED light-emitting chip 102 and the third LED light-emitting chip 103 may be the red LED light-emitting chip, the green LED light-emitting chip and the blue LED light-emitting chip respectively, or may be the blue LED light-emitting chip, the green LED light-emitting chip and the red LED light-emitting chip respectively, or may have other arrangement. The disclosure is not limited herein.

In an embodiment, the metal via hole has a diameter equal to or greater than 0.2 mm, and is filled with an insulating material, so as to enhance the sealing performance of the device. During the production process, a hole should be firstly drilled in the PCB board, and then a copper layer is formed on the hole wall through electroplating copper, so as to further form the metal via hole. The larger the diameter of the metal via hole is, the lower the cost of drilling is.

In an embodiment, the insulating material includes resin or green ink. The insulating material does not exceed an upper surface or a bottom surface of the insulating substrate 100. Such filling can enhance the binding force between the packaging material and the insulating substrate 100 in subsequent device packaging, thereby improving the sealing performance.

In an embodiment, the back side of the insulating substrate 100 is provided with an insulating layer. The insulating layer covers the rear metal wires on the back wiring board 300. The material of the insulating layer includes white ink, resin or green ink to implement insulating protection and sealing.

Figure 5:
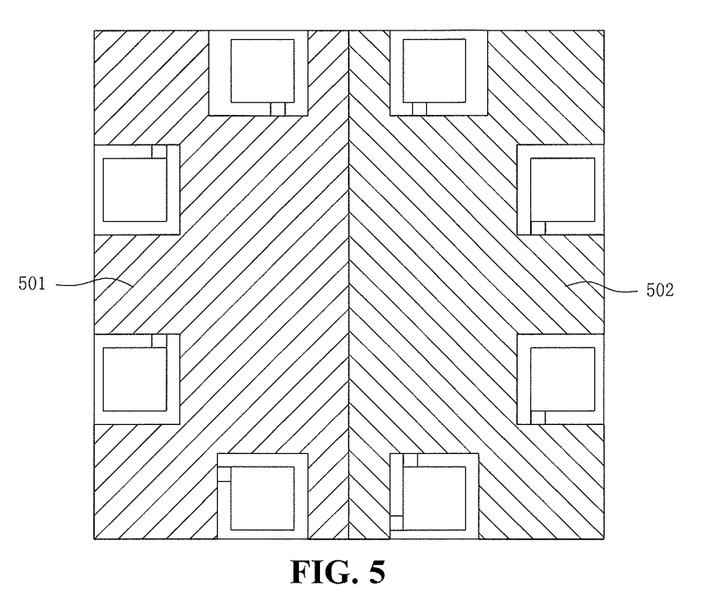
FIG. 5 is a bottom view of the LED display unit group of FIG. 2.

In an embodiment, the back side of the insulating substrate 100 is provided with an identification mark for identifying the polarity of each pin. FIG. 5 is a bottom view of the LED display unit group of FIG. 2. As shown in FIG. 5, in the embodiment of the present disclosure, the insulating layer includes two insulating materials 501 and 502 of different colors, such as white ink and green ink. The insulating layer is divided into two parts of different colors by a boundary between the two insulating materials 501 and 502 of different colors, to form the identification mark. In another embodiment of the present disclosure, a layer of the insulating layer, such as white ink, is firstly coated over the insulating substrate 100, and covers the rear metal wires on the back wiring board 300. Then the other insulating material, such as green ink, having a larger difference in the color from the insulating layer is coated on the surface of the insulating layer, the green ink may has a triangle shape or any other shape capable of identifying the polarity of each pin. Alternatively, green ink is coated over half of the surface of the insulating layer (white ink), and the back side of the LED display unit group is divided into two parts of different colors by the boundary between the white ink and the green ink, to from the identification mark shown in FIG. 5.

Figure 6:
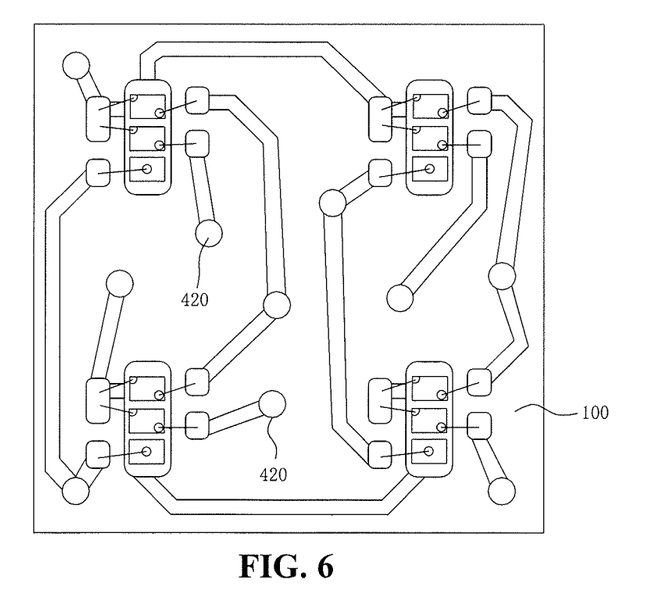
FIG. 6 is a front wiring diagram of another LED display unit group provided by an embodiment of the present disclosure.
Figure 7:
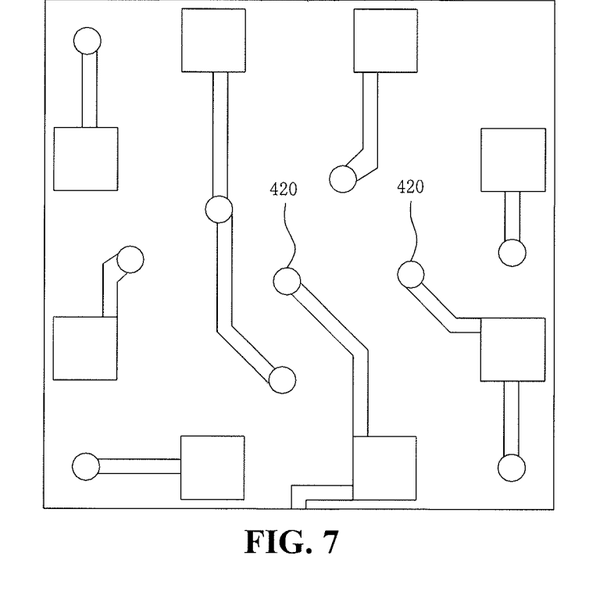
FIG. 7 is a back wiring diagram of the LED display unit group of FIG. 6.

FIG. 6 is a front wiring diagram of another LED display unit group provided by an embodiment of the present disclosure. FIG. 7 is a back wiring diagram of the LED display unit group of FIG. 6. As shown in FIG. 6 and FIG. 7, the LED display unit group includes four pixel units arranged in an array. The arrangement of the LED light-emitting chips and the bonding pads of each pixel unit is exactly the same as that of the foregoing embodiments. The arrangement of the metal wires is exactly the same as that of the embodiments shown in FIG. 2 and FIG. 3, and the corresponding electrical connection relationship corresponding to each bonding pad and the electrical connection relationship between the bonding pads and the pins are the same. What is different is that the metal via hole of the embodiments shown in the FIG. 2 and FIG. 3 is replaced by a metal column 420 (such as copper column). In an embodiment, the metal column 420 has a diameter less than 0.2 mm. A hole is firstly drilled in the PCB board, and then copper is electroplated in the hole. Since the diameter of the hole is small, the hole is completely filled with the metal copper, to form the copper column. The smaller the diameter of the hole is, the better the sealing performance of the device is. The arrangement of the pins, the insulating layer and the identification mark on the back side of the insulating substrate 100 is the same as that of the foregoing embodiments, and will not be repeated.

Figure 8:
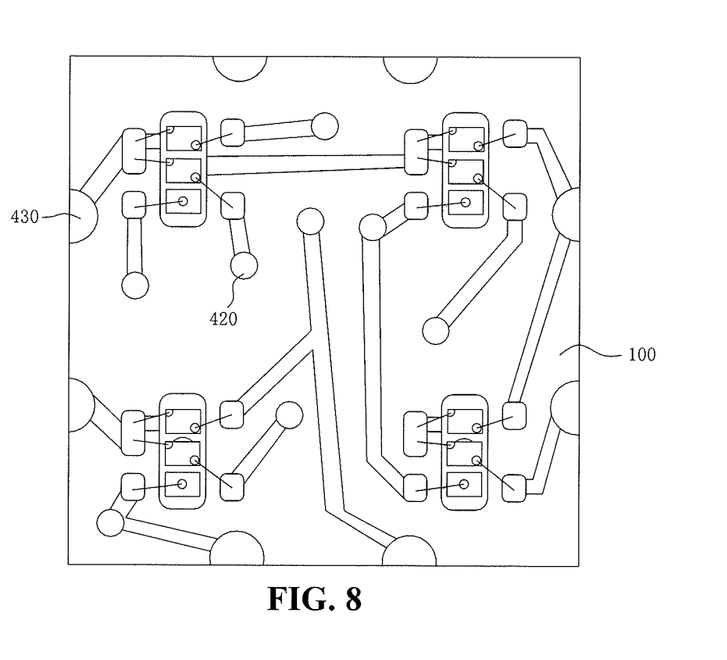
FIG. 8 is a front wiring diagram of another LED display unit group provided by an embodiment of the present disclosure.
Figure 9:
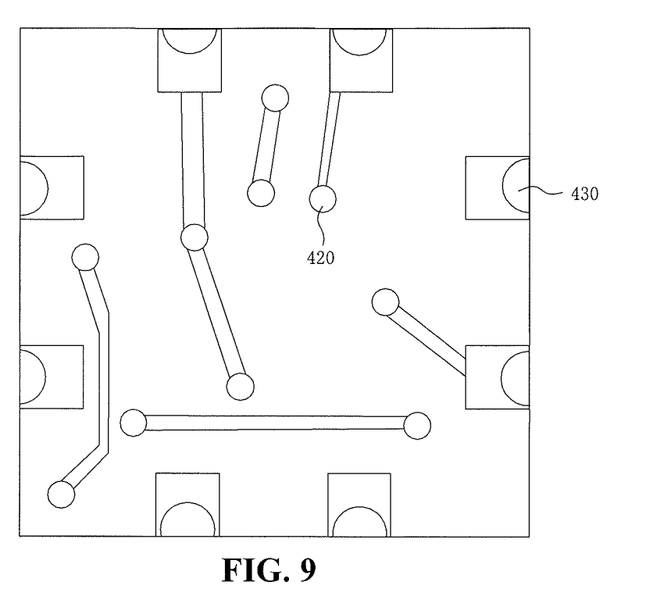
FIG. 9 is a back wiring diagram of the LED display unit group of FIG. 8.

FIG. 8 is a front wiring diagram of another LED display unit group provided by an embodiment of the present disclosure. FIG. 9 is a back wiring diagram of the LED display unit group of FIG. 8. As shown in FIG. 8 and FIG. 9, the LED display unit group includes four pixel units arranged in an array. The arrangement of the LED light-emitting chips and the bonding pads of each pixel unit is the same as that of the foregoing embodiments, and will not be repeated.

In the embodiment, the electrical connection relationship corresponding to each bonding pad and the electrical connection relationship between the bonding pads and the pins are the same as those of the foregoing embodiments. That is, the common cathode bonding pads of two pixel units of each row of pixel units are electrically connected, and to a respective common cathode pin corresponding to the each row of the pixel units; the first anode bonding pads of the two pixel units of each column of the pixel units are electrically connected, and to a respective first anode pin corresponding to the each column of pixel units; the second anode bonding pads of the two pixel units of each column of pixel units are electrically connected, and to a respective second anode pin corresponding to the each column of pixel units; the third anode bonding pads of the two pixel units of each column of pixel units are electrically connected, and to a respective third anode pin corresponding to the each column of pixel units.

The front wiring board 200 and the back wiring board 300 of the insulating substrate 100 are electrically connected through the metal via hole 430 and the metal column 420. The pins are directly electrically connected with the wires on the front side of the insulating substrate 100 through the metal via hole 430, and the metal via hole 430 has a cross section of half arc. The arrangement of the pins, the insulating layer, the identification mark on the back side of the insulating substrate 100 is the same as that of the foregoing embodiments, and will not be repeated.

It should be noted that the foregoing embodiments of the present disclosure, the present disclosure is described with reference to an example where each pixel unit includes two dual-electrode chips and one single-electrode chip. Any person skilled in the art should understand that the present disclosure is not limited to the specific embodiments described herein. For example, in other embodiments, the three LED light-emitting chips of each pixel unit are all dual-electrode chips. The anodes of all dual-electrode chips are uniformly directed in a same direction. Accordingly, the three anode bonding pads may be located on the left side of the die bonding pad, and the common cathode bonding pad may be located on the right side of the die bonding pad. The electrical connection relationship corresponding to each bonding pad and the electrical connection relationship between the bonding pads and the pins are the same as those of the foregoing embodiments. The three LED light-emitting chips may also be all inverted-assembling chips.

It should be noted that the forgoing is merely some embodiments and the technical principle of the present disclosure. Any person skilled in the art should understand that the present disclosure is not limited to the specific embodiments described herein. Any person skilled in the art may make various obvious modification, readjustment and replacement without departing from the protection scope of the present disclosure. Therefore, the present disclosure has been described in detail in the above embodiments, but is not limited thereto. Other equivalent embodiments may be included without departing from spirit and scope of the present disclosure, and the scope of the present disclosure is determined by the accompanying claims.

What is claimed is:

1. A light-emitting diode (LED) display unit group, comprising:
   a circuit board, and
   a pixel unit array located on the circuit board, wherein the pixel unit array comprises a plurality of pixel units arranged in n rows and m columns, n and m are both positive integers and greater than or equal to 2;
wherein each of the pixel units comprises a plurality of LED light-emitting chips of at least two colors, each of the LED light-emitting chips comprises an electrode A and an electrode B of opposite polarities;
the LED light-emitting chips of each of the pixel units comprises at least one dual-electrode chip, the dual-electrode chip has the electrode A and the electrode B located on a same side of the dual-electrode chip;

all dual-electrode chips of a same color in the plurality of pixel units have connecting lines from the electrode A to the electrode B directed in a same direction;

wherein the circuit board comprises:
an insulating substrate,
a front wiring board located on a front side of the insulating substrate, and
a back wiring board located on a back side of the insulating substrate;

the insulating substrate is provided with a metal via hole and/or a metal column for connecting the front wiring board and the back wiring board;

the LED light-emitting chips are fixed on the front wiring board, the electrode A and the electrode B of each of the LED light-emitting chips are electrically connected to the front wiring board;

wherein the back wiring board comprises a number n of common electrode A pins and a number 3m of electrode B pins;

electrodes A of all LED light-emitting chips of each row of pixel units are electrically connected together, and to a respective one of the common electrode A pins corresponding to the each row of pixel units;

electrodes B of all LED light-emitting chips of a same color of each column of pixel units are electrically connected together, and to a respective one of the electrode B pins corresponding to the LED light-emitting chips of the same color of the each column of pixel units.

2. The LED display unit group according to claim 1, wherein n is equal to 2, and m is equal to 2.

3. The LED display unit group according to claim 1, wherein each of the LED light-emitting chips is one of a red LED light-emitting chip, a green LED light-emitting chip or a blue LED light-emitting chip.

4. The LED display unit group according to claim 1, wherein the metal via hole has a diameter equal to or greater than 0.2 mm, and is filled with an insulating material.

5. The LED display unit group according to claim 1, wherein the metal column has a diameter less than 0.2 mm.

6. The LED display unit group according to claim 1, wherein the back side of the circuit board is provided with an insulating layer, the insulating layer covers a rear metal wire on the back wiring board.

7. The LED display unit group according to claim 1, wherein the back side of the circuit board is provided with an identification mark for identifying a polarity of each of the common electrode A pins and the electrode B pins.

8. The LED display unit group according to claim 6, wherein the insulating layer comprises two insulating materials of different colors, the insulating layer is divided into two parts of different colors by a boundary between the two insulating materials of different colors.

9. The LED display unit group according to claim 6, wherein a surface of the insulating layer is provided with an insulating material having a different color from the insulting layer for forming the identification mark for identifying a polarity of each of the common electrode A pins and the electrode B pins.

10. A display panel, comprising the LED display unit group according to claim 1;
wherein the circuit board comprises:
an insulating substrate,
a front wiring board located on a front side of the insulating substrate, and
a back wiring board located on a back side of the insulating substrate;

the insulating substrate is provided with a metal via hole and/or a metal column for connecting the front wiring board and the back wiring board;

the LED light-emitting chips are fixed on the front wiring board, the electrode A and the electrode B of each of the LED light-emitting chips are electrically connected to the front wiring board;

wherein the back wiring board comprises a number n of common electrode A pins and a number 3m of electrode B pins;

electrodes A of all LED light-emitting chips of each row of pixel units are electrically connected together, and to a respective one of the common electrode A pins corresponding to the each row of pixel units;

electrodes B of all LED light-emitting chips of a same color of each column of pixel units are electrically connected together, and to a respective one of the electrode B pins corresponding to the LED light-emitting chips of the same color of the each column of pixel units.

11. The LED display unit group according to claim 10, wherein n is equal to 2, and m is equal to 2.

12. The LED display unit group according to claim 10, wherein each of the LED light-emitting chips is one of a red LED light-emitting chip, a green LED light-emitting chip or a blue LED light-emitting chip.

13. The LED display unit group according to claim 10, wherein the metal via hole has a diameter equal to or greater than 0.2 mm, and is filled with an insulating material.

14. The LED display unit group according to claim 10, wherein the metal column has a diameter less than 0.2 mm.

15. The LED display unit group according to claim 10, wherein the back side of the circuit board is provided with an insulating layer, the insulating layer covers a rear metal wire on the back wiring board.

16. The LED display unit group according to claim 10, wherein the back side of the circuit board is provided with an identification mark for identifying a polarity of each of the common electrode A pins and the electrode B pin.

* * * * *